US011604903B2

(12) United States Patent
Tribedi et al.

(10) Patent No.: US 11,604,903 B2
(45) Date of Patent: Mar. 14, 2023

(54) LAYERED ANALYTICAL MODELING OF TELECOM TOWER STRUCTURE AND SCENARIO ANALYSIS

(71) Applicant: Bentley Systems, Incorporated, Exton, PA (US)

(72) Inventors: Apurba Tribedi, Yorba Linda, CA (US); Pankaj Taneja, Fullerton, CA (US); Achintya Tribedi, West Bengal (IN); Aaron Poot, Downey, CA (US); Adam Junstrom, Pittsburgh, PA (US); Daniel Smilozwitz, Pittsburgh, PA (US); Bryan Clinton, Pittsburgh, PA (US)

(73) Assignee: Bentley Systems, Incorporated, Exton, PA (US)

( * ) Notice: Subject to any disclaimer, the term of this patent is extended or adjusted under 35 U.S.C. 154(b) by 1042 days.

(21) Appl. No.: 16/268,142

(22) Filed: Feb. 5, 2019

(65) Prior Publication Data

US 2019/0340311 A1 Nov. 7, 2019

(30) Foreign Application Priority Data

May 2, 2018 (IN) .............................. 201811016593

(51) Int. Cl.
*G06F 30/13* (2020.01)
*G06Q 10/0631* (2023.01)
(Continued)

(52) U.S. Cl.
CPC .......... *G06F 30/13* (2020.01); *G06F 16/2282* (2019.01); *G06F 16/284* (2019.01); *G06Q 10/06311* (2013.01)

(58) Field of Classification Search
CPC ........ G06F 30/00; G06F 30/13; G06F 16/284; G06F 16/2282; G06Q 10/06311
(Continued)

(56) References Cited

U.S. PATENT DOCUMENTS

2018/0249343 A1* 8/2018 Priest ...................... G06F 30/13
2018/0300439 A1* 10/2018 Semaan ............. H01Q 21/0087

FOREIGN PATENT DOCUMENTS

CN 111913935 A * 11/2020

OTHER PUBLICATIONS

Gencturk, B. et al, "Optimal Design of Lattice Wind Turbine Towers", 2012, 15 WCEE, Lisboa. (Year: 2012).*
(Continued)

*Primary Examiner* — Cedric Johnson
(74) *Attorney, Agent, or Firm* — Cesari and McKenna, LLP; James A. Blanchette

(57) ABSTRACT

In one embodiment, a design application is provided that utilizes layered analytical modeling in a design and analysis workflow. An analytical model may be described in a model file by a base geometry and a plurality of analysis parameters, including modification geometries that define changes that can be made to the base geometry, loading definitions that define how loads are evaluated, and appurtenances groups and configurations that define the nature and arrangement of appurtenances. A user may select analysis parameters which together with the base geometry define a scenario. A plurality of scenarios may be maintained within the same model file. When a particular scenario is to be visualized and analyzed, the analysis parameters of a scenario are layered on to (i.e. merged with) the base geometry.

20 Claims, 10 Drawing Sheets

(51) Int. Cl.
G06F 16/22 (2019.01)
G06F 16/28 (2019.01)

(58) Field of Classification Search
USPC .............................................................. 703/1
See application file for complete search history.

(56) References Cited

OTHER PUBLICATIONS

Das, Amlan et al., "Modeling and Analysis of Lattice Towers for Wind Turbines", Apr. 2015, International Journal of Science and Research (IJSR), vol. 4, Issue 4. (Year: 2015).*

Das, Amlan, et al., "Modelling and Analysis of Lettice Towers for Wind Turbines," International Journal of science and Research (IJSR), vol. 4, Issue 4, Apr. 2015, pp. 999-1003.

Gahlawat, Vikas, et al., "Analysis and Design of a 25-Metre-Tall Steel Transmission Tower," International Journal of Engineering Technology, Management and Applied Sciences (IJETMAS), vol. 3, Issue 7, Jul. 2015, pp. 32-35.

STAAD.Pro: V8i (SELECTseries 4), Technical Reference Manual, Nov. 19, 2012, pp. 1-775.

"STAAD(X) Tower: V8i SELECTseries 1," User Manual, Bentley Systems, Incorporated, 2008, pp. 1-203.

"STAAD(X).TOWER: Structural Modeling, Analysis and Design Solution for Communication Towers," Product Data Sheet, Bentley Systems, Incorporated, Nov. 2008, pp. 1-2.

\* cited by examiner

Table For Storing Tower Data — 510

Tablefields

| Fieldname | Fieldtype | Default Value | Fieldconstraint |
|---|---|---|---|
| TowerID (512) | TEXT | | NULL |
| TowerInformation | BLOB | | NULL |
| BaseGeometryData (514) | BLOB | | NULL |
| StxtFile | BLOB | | NULL |
| BaseGeometryXML (516) | BLOB | | NULL |
| ChangeBy | VARCHAR(100) | | NULL |
| ChangeDate | TEXT | | NULL |

Table For Storing Mod Data — 530

Tablefields

| Fieldname | Fieldtype | Default Value | Fieldconstraint |
|---|---|---|---|
| TowerID (512) | TEXT | | NULL |
| ModificationID (523) | TEXT | | NULL |
| ModificationDescription (532) | TEXT | | NULL |
| ModificationData (534) | BLOB | | NULL |
| ChangeBy | VARCHAR(100) | | NULL |
| ChangeDate | TEXT | | NULL |

Table For Storing Scenario Data — 520

Tablefields

| Fieldname | Fieldtype | Default Value | Fieldconstraint |
|---|---|---|---|
| TowerID (512) | TEXT | | NULL |
| WorkOrderID (521) | TEXT | | NULL |
| ScenarioID (522) | TEXT | | NULL |
| ModificationID (523) | TEXT | | NULL |
| AntennaGroupID (524) | TEXT | | NULL |
| AntennaConfigurationID (525) | VARCHAR(50) | | NULL |
| WindDefinitionID (526) | VARCHAR(50) | | NULL |
| SeismicDefinitionID (527) | VARCHAR(50) | | NULL |
| ChangeBy | VARCHAR(100) | | NULL |
| ChangeDate | TEXT | | NULL |
| StxtFile | BLOB | | NULL |
| IsActive | INTEGER | | NULL |

```xml
<TowerStructureDetail>
<TowerSectionData TowerType="SelfSupported" TowerConvention="US_CONVENTION" DesignCode="EN1993_3_1"
TowerShape="ISOTRIANGLE" UnitType="English" StructureType="BaseStructure" NoOfLeg="3" IsSupportNeeded
="True"/>
<Panel ID="1" TopFaceDepth="4 ft" TopWidth="4 ft" TopElevation="150 ft" BottomElevation="140 ft"
BottomFaceDepth="4 ft" BottomWidth="4 ft" SectionLength="10 ft" NoOfBays="2" TopGirtOffset="0 in"
BottomGirtOffset="0 in" DiagonalSpacing="60 in" IsTrussLeg="False" ElevationToConsider="150">
<FaceBracingDetails AllFaceIdentical="True" AllBaysIdentical="True">
<Face ID="1" Name="FaceA">
<Bays>
<Bay ID="1" Name="K1 Down" Length="5 ft" TopElevation="150 ft" BaseElevation="145 ft"
BaseWidth="4 ft" TopWidth="4 ft" Leg="Pipe25CH40" LegMaterial="A53 Gr. B" LegShape=
"AISC13-PIPE"/>
<UserDetails>
<UserData Name="RV" Type=bool" Value="false" />
<UserData Name="BGirt" Type="bool" Value="false" />
<UserData Name="RSH" Type="bool" Value="false" />
</UserDetails>
<SECTIONS>
<Section MemberTag="DIAGONAL" SectionName="L2X2X3/16" MaterialName="A36" ShapeName
="AISC7-L" />
<Section MemberTag="HORIZONTAL" SectionName="L2X2X3/16" MaterialName="A36"
ShapeName="AISC7-L" />
<Section MemberTag="REDUNDANTDIAGONAL" SectionName="L2X2X3/16" MaterialName="A36"
ShapeName="AISC7-L" />
<Section MemberTag="REDUNDANTHORIZONTAL" SectionName="L2X2X3/16" MaterialName="A36"
ShapeName="AISC7-L" />
</SECTIONS>
</Bay>
<Bay ID="2" Name="K1 Down" Length="5 ft" TopElevation="145 ft" BaseElevation="140 ft"
BaseWidth="4 ft" TopWidth="4 ft" Leg="Pipe25CH40" LegMaterial="A53 Gr. B" LegShape=
"AISC13-PIPE">...</Bay>
</Bays>
</Face>
<Face ID="2" Name="FaceB">...</Face>
<Face ID="3" Name="FaceC">...</Face>
</FaceBracingDetails>
<PlanBracingDetails>...</PlanBracingDetails>
<HipBracingDetails AllLegIdentical="True">...</HipBracingDetails>
```

FIG. 6A

```xml
</Panel>
<Panel ID="2" TopFaceDepth="4 ft" TopWidth="4 ft" TopElevation="140 ft" BottomElevation="120 ft" BottomFaceDepth="6 ft" BottomWidth="6 ft" SectionLength="20 ft" NoOfBays="3" TopGirtOffset="0 in" BottomGirtOffset="0 in" DiagonalSpacing="80 in" IsTrussLeg="False" ElevationToConsider="140">
<FaceBracingDetails AllFaceIdentical="True" AllBaysIdentical="True">
<Face ID="1" Name="FaceA">
<Bays>
<Bay ID="1" Name="K3 Down" Length="6.6666666666667 ft" TopElevation="140 ft" BaseElevation="133.33333333333 ft" BaseWidth="4.6666666666667 ft" TopWidth="4 ft" Leg="Pipe25CH40" LegMaterial="A53 Gr. B" LegShape="AISC13-PIPE">
<UserDetails>
<UserData Name="RV" Type="bool" Value="false" />
<UserData Name="RSH" Type="bool" Value="false" />
<UserData Name="BGirt" Type="bool" Value="false" />
</UserDetails>
<Sections>
<Section MemberTag="DIAGONAL" SectionName="L2X2X3/16" MaterialName="A36" ShapeName="AISC7-L" />
<Section MemberTag="HORIZONTAL" SectionName="L2X2X3/16" MaterialName="A36" ShapeName="AISC7-L" />
<Section MemberTag="REDUNDANTHORIZONTAL1" SectionName="L2X2X3/16" MaterialName="A36" ShapeName="AISC7-L" />
<Section MemberTag="REDUNDANTDIAGONAL1" SectionName="L2X2X3/16" MaterialName="A36" ShapeName="AISC7-L" />
<Section MemberTag="REDUNDANTDIAGONAL2" SectionName="L2X2X3/16" MaterialName="A36" ShapeName="AISC7-L" />
<Section MemberTag="REDUNDANTHORIZONTAL2" SectionName="L2X2X3/16" MaterialName="A36" ShapeName="AISC7-L" />
<Section MemberTag="REDUNDANTHORIZONTAL3" SectionName="L2X2X3/16" MaterialName="A36" ShapeName="AISC7-L" />
<Section MemberTag="REDUNDANTDIAGONAL3" SectionName="L2X2X3/16" MaterialName="A36" ShapeName="AISC7-L" />
</Sections>
</Bay>
<Bay ID="2" Name="K3 Down" Length="6.6666666666666" TopElevation="133.33333333333" BaseElevation="126.6666666666" BaseWidth="5.3333333333333" TopWidth="4.6666666666" Leg="Pipe25CH40" LegMaterial="A53 Gr. B" LegShape="AISC13-PIPE">...</Bay>
<Bay ID="3" Name="K3 Down" Length="6.6666666666666" TopElevation="126.6666666666" BaseElevation="120 ft" BaseWidth="6 ft" TopWidth="5.3333333333333" Leg="Pipe25CH40" LegMaterial="A53 Gr. B" LegShape="AISC13-PIPE">...</Bay>
```

FIG. 6B

```xml
      </Bays>
    </Face>
    <Face ID="2" Name="FaceB"></Face>
    <Face ID="3" Names"FaceC"></Face>
  </FaceBracingDetails>
  <PlanBracingDetails>...</PlanBracingDetails>
  <HipBracingDetails AllLegIdentical="True">...</HipBracingDetails>
  </Panel>
  <Panel ID="3" TopFaceDepth="6 ft" TopWidth="6 ft" TopElevation="120 ft" BottomElevation="100 ft" BottomFaceDepth="8 ft" BottomWidth="8 ft" SectionLength="20 ft" NoOfBays="3" TopGirtOffset="0 in" BottomGirtOffset="0 in" DiagonalSpacing="80 in" isTrussLeg="False" ElevationToConsider="120">...
  </Panel>
  <Panel ID="4" TopFaceDepth="8 ft" TopWidth="8 ft" TopElevation="100 ft" BottomElevation="80 ft" BottomFaceDepth="10 ft" BottomWidth="10 ft" SectionLength="20 ft" NoOfBays="3" TopGirtOffset="0 in" BottomGirtOffset="0 in" DiagonalSpacing="80 in" isTrussLeg="False" ElevationToConsider="100">...
  </Panel>
  <Panel ID="5" TopFaceDepth="10 ft" TopWidth="10 ft" TopElevation="80 ft" BottomElevation="60 ft" BottomFaceDepth="12 ft" BottomWidth="12 ft" SectionLength="20 ft" NoOfBays="3" TopGirtOffset="0 in" BottomGirtOffset="0 in" DiagonalSpacing="80 in" isTrussLeg="False" ElevationToConsider="80">...
  </Panel>
  <Panel ID="6" TopFaceDepth="12 ft" TopWidth="12 ft" TopElevation="60 ft" BottomElevation="40 ft" BottomFaceDepth="14 ft" BottomWidth="14 ft" SectionLength="20 ft" NoOfBays="3" TopGirtOffset="0 in" BottomGirtOffset="0 in" DiagonalSpacing="80 in" isTrussLeg="False" ElevationToConsider="60">...
  </Panel>
  <Panel ID="7" TopFaceDepth="14 ft" TopWidth="14 ft" TopElevation="40 ft" BottomElevation="20 ft" BottomFaceDepth="16 ft" BottomWidth="16 ft" SectionLength="16 ft" NoOfBays="3" TopGirtOffset="0 in" BottomGirtOffset="0 in" DiagonalSpacing="80 in" isTrussLeg="False" ElevationToConsider="40">...
  </Panel>
  <Panel ID="8" TopFaceDepth="16 ft" TopWidth="16 ft" TopElevation="20 ft" BottomElevation="0 ft" BottomFaceDepth="18 ft" BottomWidth="18 ft" SectionLength="18 ft" NoOfBays="3" TopGirtOffset="0 in" BottomGirtOffset="0 in" DiagonalSpacing="80 in" isTrussLeg="False" ElevationToConsider="20">...
  </Panel>
  </TowerSectionData>
  <TowerConnectionDetails>...</TowerConnectionDetails>
</TowerStructureDetail>
```

FIG. 6C

LAYERED ANALYTICAL MODELING OF TELECOM TOWER STRUCTURE AND SCENARIO ANALYSIS

CROSS-REFERENCE TO RELATED APPLICATIONS

The present application claims the benefit of Indian Patent Application Serial No. 201811016593, which was filed on May 2, 2018, by Apurba Tribedi et al. for LAYERED ANALYTICAL MODELING OF TELECOM TOWER STRUCTURE AND SCENARIO ANALYSIS, which is hereby incorporated by reference.

BACKGROUND

Technical Field

The present disclosure relates to modeling and analysis and more specifically to layered analytical modeling to improve a design and analysis workflow for telecom towers.

Background Information

As of September 2017, it is estimated that there are more than 215,000 monopole (tapered and straight), self-supporting (three leg and four leg) and guyed (three leg and four leg) communication towers (collectively "telecom towers") operating in the United States. During their operative lifecycle, telecom tower designs often go through several modifications. These modifications may take the form of geometric modifications (changes to the arrangement and type of panels, nodes, members, guy, cables, or other components of the structure), loading modifications (changes to loading criteria for the structure), and appurtenances modification (changes to the type or arrangement of equipment attached to the structure, such as antennas, antenna mounts, conduits, climbing devices, platforms, etc.). Prior to implementation, a structural engineer typically must analyze geometric, loading and appurtenance modifications to a design (collectively referred to as "analysis parameters") in a software-assisted process referred to as a design and analysis workflow.

In a typical design and analysis workflow, when a structural engineer receives a work order, they typically must gather documents and data from a number of different data sources and prepare a model (e.g., an analytical model) that reflects the telecom tower. This model is typically stored in a model file. The structural engineer may manually modify the model to try different combinations of analysis parameters that represent "what-if" cases. Each modified model is typically stored in its own model file. The structural engineer may individually examine and analyze the modified models, for example, to determine whether applicable design codes, slenderness requirements, member codes, etc. are met. Iterative refinements may be made to one of the separate model files in light of the results of the individual analysis. Changes to one model file are not automatically propagated to other model files. Eventually, a preferred model file is selected for implementation.

While functional, such a design and analysis workflow can be highly inefficient. Typically, structural engineers are faced with high throughput (e.g., telecom infrastructure firms may generate work orders for hundreds of towers per week) and are required to meet short turnaround times on their design and analysis tasks. Since each "what if" case is typically individually modeled and maintained separately in its own model file, a great deal of time and effort may be required manually updating different model files as the design evolves to maintain consistency of analysis parameters that are not purposefully altered. If a structural engineer desires to try a new "what-if" case, they are burdened with creating a new model file and redefining many analysis parameters, including analysis parameters that are not purposefully altered in the new "what if" case.

Further, a compact and reliable history of changes to analysis parameters is typically not maintained in a conventional design and analysis workflow. Since a large number of model files may be generated, there is typically no unified history of design changes (e.g., no single source of truth). Further, there is typically significant data duplication among the model files, inefficiently consuming extra storage and network bandwidth resources.

Accordingly, there is a need for an improved design and analysis workflow that may be applicable to telecom towers.

SUMMARY

A design application is provided that utilizes layered analytical modeling to improve a design and analysis workflow for structures, such as telecom towers. An analytical model may be described in a model file by a base geometry and a plurality of analysis parameters, including modification geometries that define changes that can be made to the base geometry, loading definitions that define how loads are evaluated, and appurtenances groups and configurations that define the nature and arrangement of appurtenances. A user may select analysis parameters which together with the base geometry define a scenario. A plurality of scenarios may be maintained within the same model file. When a particular scenario is to be visualized and or analyzed, the analysis parameters of a scenario are layered on to (i.e. merged with) the base geometry, without changing the base geometry, to produce a unified description. By layering different analysis parameters of different scenarios onto the same base geometry, a variety of "what if" cases can be tested. In this manner, the model file may act as an archive of possible changes, while avoiding data duplication. Further the model file can serve as a single source of truth, avoiding uncertainty and inconsistencies introduced by multiple model files.

In one embodiment, a design application that employs a layered analytical model may load a model file for a telecom tower from a data repository. The model file includes a base geometry for the telecom tower and a plurality of analysis parameters, such as modification geometries that define changes that can be made to the base geometry of the telecom tower, loading definitions that define how loads incident on the telecom tower are evaluated, and appurtenances groups and configurations that define the nature and arrangement of appurtenances that can be attached to the telecom tower. The design application provides a user interface in which a user may enter selections of one or more analysis parameters from the plurality of analysis parameters to define a scenario. A data merge engine of the design application merges the base geometry and selected analysis parameters to produce a unified description, the analysis parameters being layered onto the base geometry. A data model engine of the design application then processes the unit tied description to generate visualization and analysis results for the scenario, which may be displayed in the user interface of the design application. The scenario may be saved in the model file for later reference, along with other scenarios defined by different selections of analysis parameters.

It should be understood that a variety of additional features and alternative embodiments may be implemented other than those discussed in this Summary. This Summary is intended simply as a brief introduction to the reader for the further description that follows, and does not indicate or imply that the examples mentioned herein cover all aspects of the disclosure, or are necessary or essential aspects of the disclosure.

BRIEF DESCRIPTION OF THE DRAWINGS

The application refers to the accompanying drawings of example embodiments, of which:

FIG. 5 is a diagram of an example model file structured as a collection of data tables;

FIGS. 6A-C are a listing of an example unified description that may be created for a scenario;

DETAILED DESCRIPTION

Figure 1:
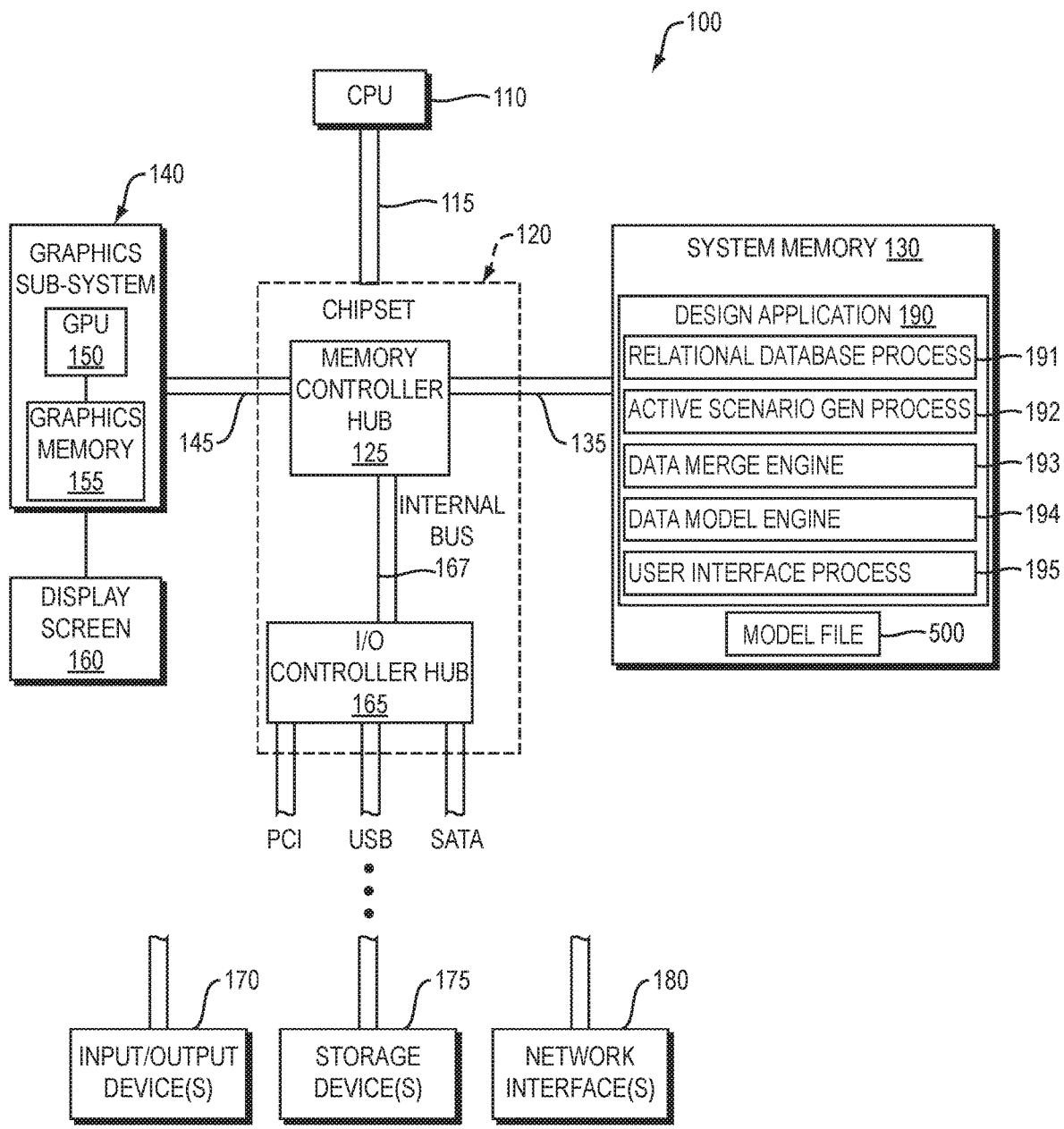
FIG. 1 is a block diagram of an example electronic device (e.g., a computer) that may be used in an improved design and analysis workflow.

FIG. 1 is a block diagram of an example electronic device 100 (e.g., a computer) that may be used in an improved design and analysis workflow. The electronic device includes a central processing unit (CPU) 110 that may be coupled to a chipset 120 by a front side bus 115. The chipset 120 includes a memory controller hub 125 that is responsible for communications with high-speed devices such as system memory 130 and a graphics subsystem (e.g., a graphics card) 140. The memory controller hub 125 is coupled to the system memory 130 by a high-speed memory bus 135. The system memory 130 is typically volatile memory, such as a Random Access Memory (RAM), which is adapted to store a wide range of software and data being actively used by the CPU 110. The memory controller hub 125 is coupled to a graphics subsystem 140 (e.g., a graphics card) by a high-speed graphics bus 145. The graphics subsystem 140 includes a GPU 150 and graphics memory 155, among other components. The graphics subsystem 140 is coupled to at least one display screen 160.

The chipset 120 further includes an input/output controller hub 165 coupled to the memory controller hub by an internal bus 167. Among other functions, the input/output controller hub 165 may support a variety of types of peripheral buses for connecting to other system components. The system components may include one or more I/O devices 170, such as a keyboard, a mouse, a removable media drive, etc., one or more persistent storage devices 175, such as a hard disk drive, a solid-state drive, or another type of persistent data store, one or more network interfaces 180, such as an Ethernet interface or a Wi-Fi adaptor, among other system components. The network interface(s) 180 may allow communication with other electronic devices over a computer network, such as the Internet, to enable various types of collaborative, distributed, or remote computing.

Working together, the components of the electronic device 100 (and other electronic devices in the case of collaborative, distributed, or remote computing) may execute a number of different types of software, and access a number of different types of data persistently stored in storage devices 175 or in a storage location remotely accessible over network interface(s) 180 and loaded into memory 130 when needed. The software may include a design application 190 that includes a number of software processes, including a relational database process 191, an active scenario guidance process 192, a data merge engine 193, a data model engine 194 and a user interface process 195. In one embodiment the design application is the STAAD(X) .Tower design and analysis application available from Bentley Systems., Inc. of Exton, Pa. However, it should be understood that the design application 190 may take a number of different forms. The data may include files of a data repository (local or remote), including model files 500 that each describe telecom towers using models. The models may include layered analytical models (sometimes referred to herein simply as "models"). The model files 500 may each take the form of relational database files, as discussed in more detail below.

Figure 2:
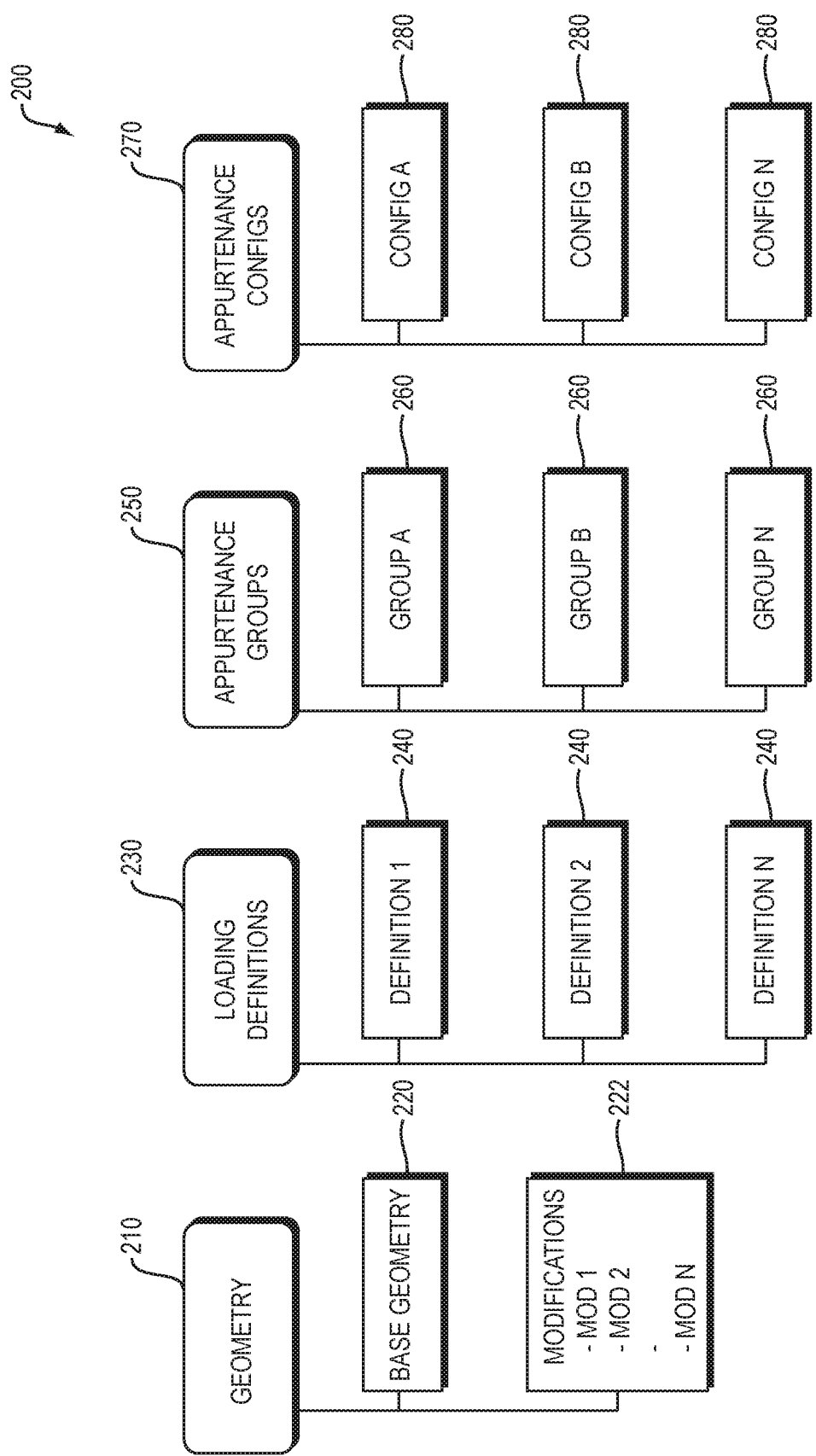
FIG. 2 is an abstracted block diagram of analysis parameters that can be selected to build an example scenario for a telecom tower.

A telecom tower may be characterized according to a number of scenarios that represent "what if" cases. Using layered analytical modeling, each scenario is defined by a base geometry and user-selected analysis parameters that are layered upon the base geometry to create the scenario. FIG. 2 is an abstracted block diagram 200 of analysis parameters that can be selected from to build an example scenario for a telecom tower. The geometry 210 of the telecom tower (e.g., the arrangement and properties of model entities, such as member segments and nodes) is defined by a base geometry 220 of the telecom tower and one or more modification geometries 222 that may be specified by the user, which define changes to the base geometry of the telecom tower. Loading definitions 230 of the telecom tower (e.g., the static and dynamic loads incident on the telecom tower) are defined by one or more definitions 240. Each definition 240 may include a user-specified wind load definition, seismic load definition, loading design standards, as well as other definitions regarding how loads should be applied. Appurtenance groups 250 of the telecom tower (e.g., antennas or other equipment attached to the telecom tower) are defined by one or more groups 240 that may be specified by the user. Each group 260 may include a description of linear and discrete appurtenances of the telecom tower. Appurtenances configurations 270 of the telecom tower are defined by one or more configurations 280 that may be defined by the user to describe the arrangement of appurtenances attached to the telecom tower.

Figure 3:
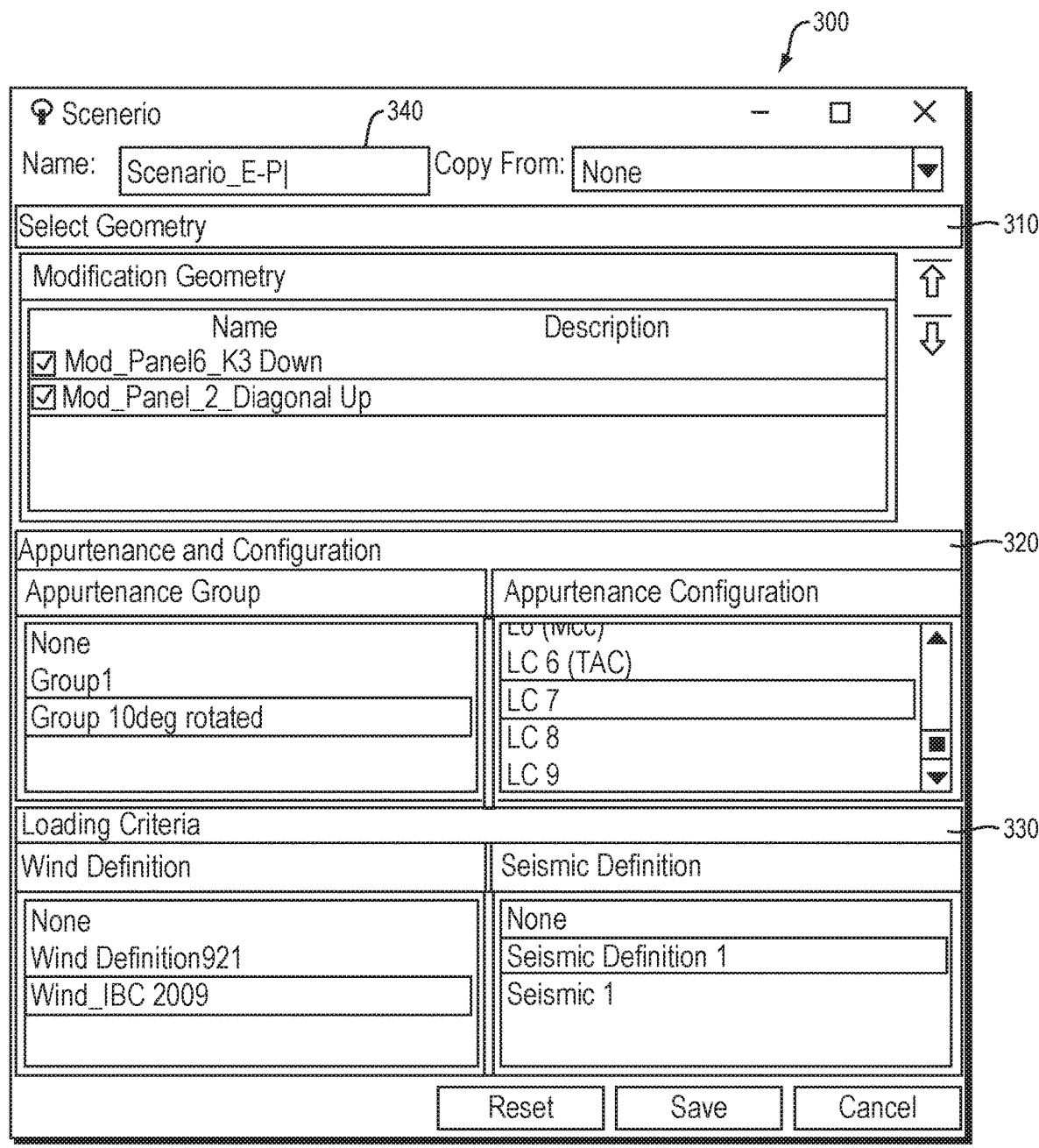
FIG. 3 is a screen shot of an example user interface that may be displayed by the user interface process of the design application to receive user-selections of previously-defined analysis parameters.

A user may define and select the analysis parameters, including modification geometries, loading definitions, and appurtenances groups and configurations, to create a scenario in a user-interface of the design application 190. FIG. 3 is a screen shot of an example user interface 300 that may be displayed by the user interface process 195 of the design application 190 to receive user-selections of previously-defined analysis parameters. The user interface includes a modification geometry field 310 in which a user may select one or more modification geometries that define changes that can be made to the base geometry of the telecom tower, an appurtenance and configuration field 320 in which a user may select one or more appurtenances groups that define the nature of appurtenances attached to the telecom tower and one or more appurtenance configurations that define the arrangement of the appurtenances on the telecom tower, and a loading criteria 330 field in which a user may select one or more loading definitions (such as wind definitions and seismic definitions) that define how loads incident on the telecom tower are evaluated. The user may name the scenario by entering text in a scenario name field 340. Such name may be used as a scenario identified (ID).

Figure 4:
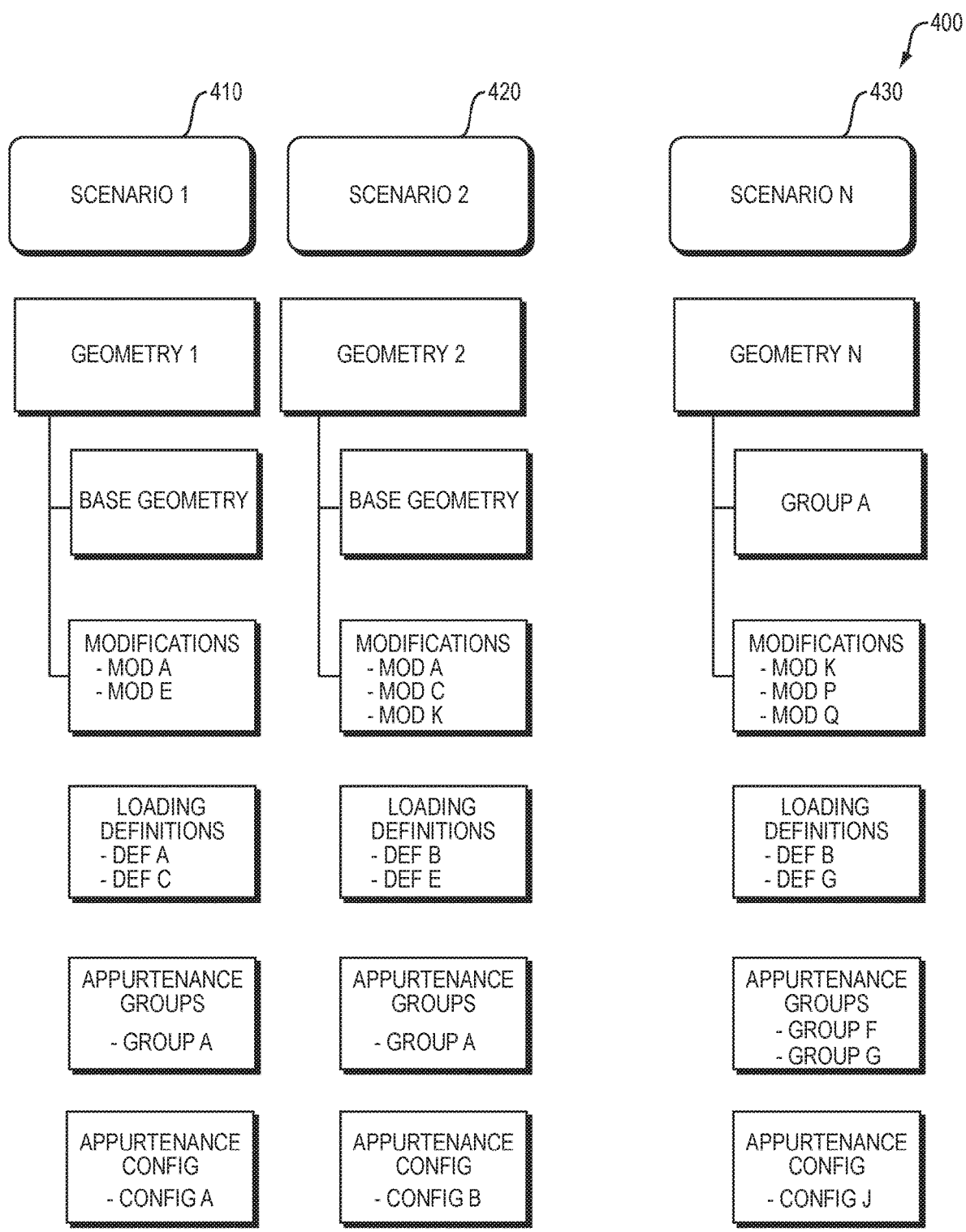
FIG. 4 is a block diagram illustrating a plurality of scenarios that may be maintained within the same model file.

A plurality of different scenarios for the telecom tower having different scenario IDs may be created using the user interface 300, and each stored in the model file 500. FIG. 4 is a block diagram 400 illustrating a plurality of scenarios that may be maintained within the same model file 500. A first scenario 410 has a first geometry defined by a base geometry, upon which a first set of modification geometries (e.g., "Mod A" and "Mod E") are layered. The first scenario is further defined by a first set of loading definitions (e.g., "Def A" and "Def C"), appurtenance groups (e.g., "Group A") and appurtenance configurations (e.g., Config A"). A second scenario 420 has a second, different geometry that is defined by the same base geometry, upon which a different set of modification geometries (e.g., "Mod A", "Mod C" and "Mod K") are layered. The second scenario is also defined by a second set of loading definitions (e.g., "Def B" and "Def C"), appurtenance groups (e.g., "Group A") and appurtenance configurations (e.g., Config B"). A number of additional scenarios 430 having different geometries and/or other analysis parameters may further be maintained within the model file 500.

Since each scenario utilizes the same common base geometry, and potentially one or more of the same analysis parameters, data duplication may be avoided. Further, since scenarios may be created without changing the base geometry or other scenarios, a comprehensive archive of potential changes to analysis parameters can be maintained within the same model file 500. To achieve these advantages, a model file 500 may be arranged as a collection of data tables that are accessible via the relational database process 191 of the design application 190.

FIG. 5 is a diagram of an example model file 500 structured as a collection of data tables 510, 520, 530. The model file 500 may include a tower data table 510 that, among other functions, defines the base geometry of the telecom tower. The tower data table 510 includes a field storing the tower ID 512, which as discussed below, may serve as a key in other data tables 520, 530. The base geometry is defined by a base geometry data blob 514 and a base geometry extensible markup language (XML) blob 516 that collectively describe the arrangement of model entities and their properties.

The model file 500 may also include one or more scenario data tables 520 that each define a collection of analysis parameters. A scenario data table 520 is identified by the tower ID 512, as well as a work order ID 521 (e.g., of a work order requesting modifications to the telecom tower) and a scenario ID 522, which serve as keys. The analysis parameters are defined by a modification ID 523 that identifies a modification table 530 that defines a modification geometry for the scenario, appurtenance IDs (such as an antenna group ID 524 and antenna configuration ID 525) that identify respective tables (not shown) that store a description of appurtenances included in the scenario, and loading IDs (such as a wind definition ID 526 and a seismic definition ID 527) that identify respective tables (not shown) that store descriptions of loads incident on the telecom tower in the scenario.

A modification table 530 is identified by the tower ID, as well as a modification ID, which serve as keys. The modification geometry is defined by a modification description 532 and a modification data blob 534 that collectively describe changes to the geometry.

When a particular scenario is to be visualized and analyzed, the active scenario guidance process 192 of the design application 190 identifies and accesses the analysis parameters of the scenario and provides them to the data merge engine 193, which layers them on (i.e. merges them with) the base geometry to create a unified description. FIGS. 6A-C are a listing 600 of an example unified description that may be created by the data merge engine 193 of the design application for a scenario. The unified description 600 may be provided to the data model engine 194 of the design application 190, which generates a visualization of the model that may be displayed by the user interface process 195 in a user interface on the display screen 160.

Figure 7:
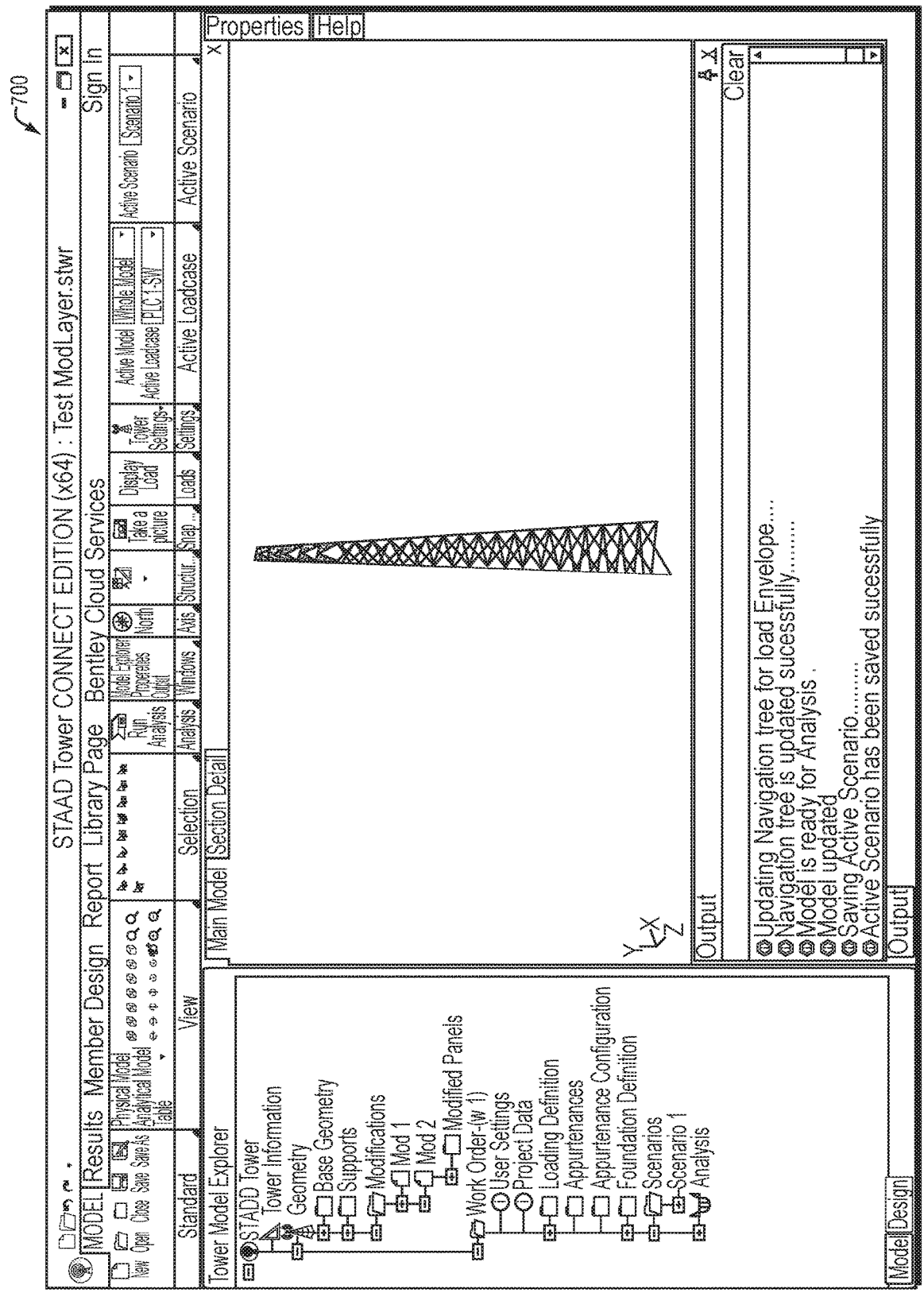
FIG. 7 is a screen shot of an example user interface that may be displayed showing a visualization of a layered analytical model.

FIG. 7 is a screen shot 700 of an example user interface that may be displayed showing a visualization of a layered analytical model. A tower model explorer window 710 may allow a user to navigate the model, while a main model window may present the visualization. Status and activity information may be displayed in an output window 730.

The data model engine 194 may further analyze the model and produce a report of analysis results (e.g., indicating whether the scenario meets applicable design codes (e.g., TIA/EIA-222-F, TIA/EIA-222-G, etc.), slenderness requirements, member codes, etc.). If the analysis is favorable, the model file 500 may be used to generate construction documents, which are dispatched to field workers who implement the scenario in the physical world.

Figure 8:
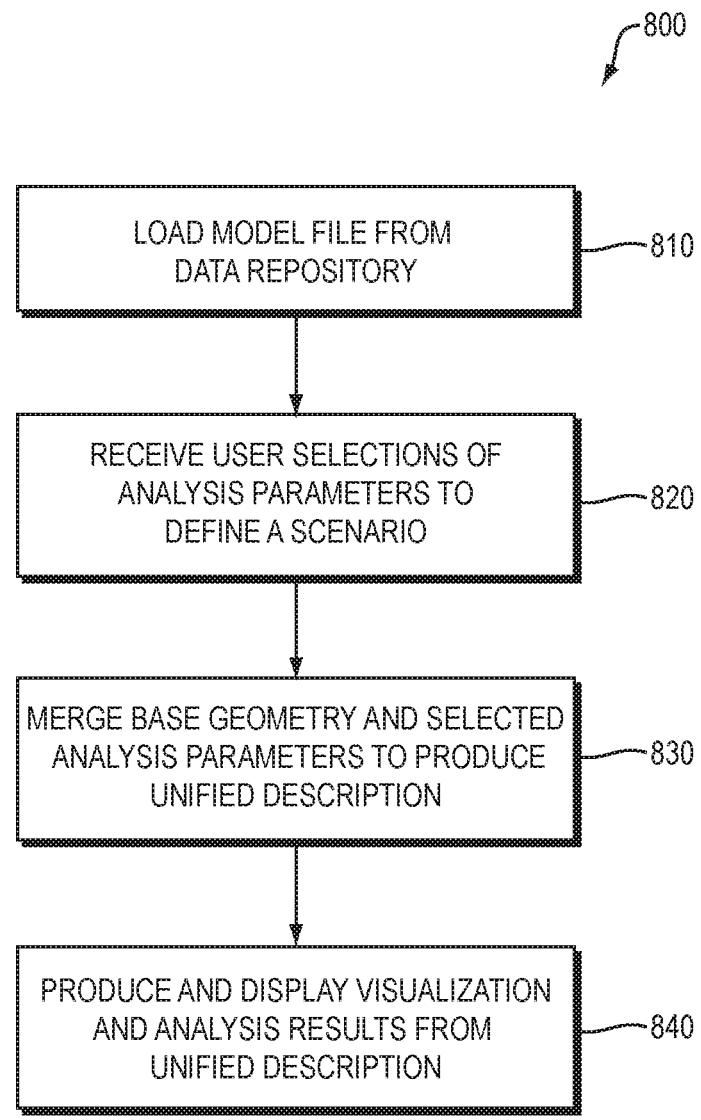
FIG. 8 is a flow diagram of an example series of operations for utilizing layered analytical modeling in an improved design and analysis workflow.

The above described operations may be summarized by reference to a flow diagram. FIG. 8 is a flow diagram of an example series of operations 800 for utilizing layered analytical modeling in an improved design and analysis workflow. At step 810, the relational database process of the design application 190 loads a model file 500 from a data repository. The model file 500 includes a base geometry for a telecom tower and a plurality of analysis parameters, such as modification geometries that define changes that can be made to the base geometry of the telecom tower, loading definitions that define how loads incident on the telecom tower are evaluated, and appurtenances groups and configurations that define the nature and arrangement of appurtenances attached to the telecom tower. At step 820, the user interface process 195 of the design application 190 receives in a user interface selections of one or more analysis parameters from the plurality of analysis parameters to define a scenario. At step 830, the data merge engine 193 of the design application 190 layers (i.e. merges) the base geometry and selected analysis parameters to produce a unified description. At step 840, the data model engine 194 of the design application 190 then processes the unified description to produce a visualization, and analyzes the unified description to produce analysis results for the scenario that may be displayed in the user interface by the user interface process 195.

In conclusion, the above description discusses certain example embodiments for using layered analytical modeling in an improve design and analysis workflow. It should be understood that a number of modifications and/or additions may be made without departing from the disclosure's intended spirit and scope. While examples are provided of the model file 500 representing a telecom tower, it should be understood that the techniques may also be used a variety of other types of structures and the model file 500 may alternatively represent other types of towers, buildings, civil constructions, equipment, etc. Further, it should be remembered that functionality may be implemented in different type of software executing on different types of hardware than discussed in the examples above, according to a variety of different types of software-hardware combinations. Software may include electronic device-executable instructions stored on a variety of types of non-transitory electronic device-readable mediums, including volatile memories, persistent storage devices, or other tangible mediums. Hardware may include various types of stationary and mobile computing devices, mobile devices, application specific devices, and/or other types of hardware devices. Above all, it should be understood that the above description is meant to be taken only by way of example.

What is claimed is:

1. A method for design and analysis of telecom towers with a design application that performs layered analytical modeling, comprising:
   loading from a data repository into the design application executing on an electronic device a model file for a telecom tower, the model file including:
      a base geometry for the telecom tower that describes arrangement and properties of segments and nodes that form the telecom tower, and
      a plurality of analysis parameters including modification geometries that define changes that can be made to the arrangement and properties of segments and nodes of the base geometry of the telecom tower, loading definitions that define how loads incident on the telecom tower are evaluated, and appurtenances groups and configurations that define the nature and arrangement of appurtenances attached to the telecom tower;
   receiving, in a user interface of the design application, a selection of one or more analysis parameters from the plurality of analysis parameters to define a scenario;
   merging, by a data merge engine of the design application, the base geometry and analysis parameters of the scenario to generate a unified description; and
   generating visualization and analysis results for the scenario from the unified description that are displayed to a user in the user interface.

2. The method of claim 1, further comprising:
   storing the scenario to the model file,
   wherein the model file includes a plurality of scenarios that are each defined by different selections of one or more analysis parameters included in the model file.

3. The method of claim 2, wherein the plurality of scenarios share the same base geometry to avoid data duplication.

4. The method of claim 3, wherein at least two of the plurality of scenarios share one or more analysis parameters included in the model file to avoid data duplication.

5. The method of claim 2, wherein the plurality of scenarios represents a history of changes to analysis parameters for the telecom tower.

6. The method of claim 1, wherein the model file is structured as a collection of data tables accessed by a relational database process of the design application, the data tables including at least a tower data table that defines the base geometry of the telecom tower, one or more scenario data tables that each define a collection of analysis parameters, and a modification table that defines a modification geometry for the scenario.

7. The method of claim 1, wherein the loading definitions include a wind definition and a seismic definition.

8. The method of claim 1, wherein the appurtenances groups and configurations comprise groups and configurations that define the nature and arrangement of equipment attached to the telecom tower.

9. The method of claim 1, further comprising:
   dispatching field workers to implement the modification geometries of the scenario in the physical world.

10. An electronic device usable to perform layered analytical modeling for design and analysis of telecom towers comprising:
    a display screen;
    a processor; and
    a memory coupled to the processor and configured to store a model file including a base geometry for a telecom tower that describes arrangement and properties of segments and nodes that form the telecom tower, a plurality of analysis parameters for the telecom tower including at least modification geometries that define changes that can be made to the arrangement and properties of segments and nodes of the base geometry of the telecom tower and appurtenances groups and configurations that define the nature and arrangement of appurtenances including antennas attached to the telecom tower, and a plurality of scenarios that are each defined by different selections of one or more analysis parameters included in the model file, and a design application executable on the processor, the design application including:
       an active scenario guidance process configured to identify and access the analysis parameters of a selected scenario from the model file,
       a data merge engine configured to merge the base geometry and analysis parameters of the selected scenario to generate a unified description,
       a data model engine configured to generate visualization and analysis results for the selected scenario from the unified description, and
       a user interface process configured to display the visualization and analysis results in a user interface on the display screen.

11. The electronic device of claim 10, wherein the analysis parameters further include loading definitions that define how loads incident on the telecom tower are evaluated.

12. The electronic device of claim 10, wherein the plurality of scenarios share the same base geometry to avoid data duplication.

13. The electronic device of claim 10, wherein at least two of the plurality of scenarios share one or more analysis parameters included in the model file to avoid data duplication.

14. The electronic device of claim 10, wherein the plurality of scenarios represents a history of changes to analysis parameters for the telecom tower.

15. The electronic device of claim 10, wherein the model file is structured as a collection of data tables accessed by a relational database process of the design application, the data tables including at least a tower data table that defines the base geometry of the telecom tower, one or more scenario data tables that each define a collection of analysis parameters, and a modification table that defines a modification geometry for the scenario.

16. The electronic device of claim 10, wherein the loading definitions include a wind definition and a seismic definition.

17. A non-transitory electronic device readable medium storing instructions executable on processors of one or more electronic devices, the instructions when executed are operable to:

load a model file for a structure, the model file including:

a base geometry for a structure that describes arrangement and properties of segments and nodes that form the structure; and a plurality of analysis parameters including at least modification geometries that define changes that can be made to the base geometry of the structure, and appurtenances groups and configurations that define the nature and arrangement of appurtenances attached to the telecom tower;

receive selections of one or more analysis parameters from the plurality of analysis parameters to define a scenario;

merge the base geometry and analysis parameters of the scenario to generate a unified description;

generate a visualization and analysis results for the scenario from the unified description; and store the scenario to the model file;

wherein the model file includes a plurality of scenarios that are each defined by different selections of one or more analysis parameters included in the model file.

18. The non-transitory electronic device readable medium of claim 17, wherein the analysis parameters further include loading definitions that define how loads incident on the structure are evaluated.

19. The non-transitory electronic device readable medium of claim 17, wherein the plurality of scenarios share the same base geometry to avoid data duplication.

20. The non-transitory electronic device readable medium of claim 17, wherein at least two of the plurality of scenarios share one or more analysis parameters included in the model file to avoid data duplication.

* * * * *

UNITED STATES PATENT AND TRADEMARK OFFICE
CERTIFICATE OF CORRECTION

PATENT NO. : 11,604,903 B2
APPLICATION NO. : 16/268142
DATED : March 14, 2023
INVENTOR(S) : Apurba Tribedi et al.

It is certified that error appears in the above-identified patent and that said Letters Patent is hereby corrected as shown below:

In the Specification

Column 2, Line 62 reads:
"unit tied description to generate visualization and analysis"
Should read:
-- unified description to generate visualization and analysis --

Signed and Sealed this
Fifth Day of March, 2024

Katherine Kelly Vidal
*Director of the United States Patent and Trademark Office*